US006696837B2

(12) United States Patent
Konijn

(10) Patent No.: US 6,696,837 B2
(45) Date of Patent: Feb. 24, 2004

(54) COIL SYSTEM

(75) Inventor: Jan Konijn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/243,058

(22) Filed: Sep. 13, 2002

(65) Prior Publication Data
US 2003/0052680 A1 Mar. 20, 2003

(30) Foreign Application Priority Data
Sep. 14, 2001 (EP) .............................. 01203486

(51) Int. Cl.[7] .................................................. G01V 3/00
(52) U.S. Cl. ...................................... 324/318; 324/322
(58) Field of Search ................................ 324/318, 322, 324/320, 309; 335/299; 600/424; 128/899, 653.5

(56) References Cited

U.S. PATENT DOCUMENTS 5,689,189 A * 11/1997 Morich et al. .............. 324/318
6,479,997 B1 * 11/2002 Westphal et al. ........... 324/318

FOREIGN PATENT DOCUMENTS

GB 2 331 808 A 6/1999

* cited by examiner

Primary Examiner—Diego Gutierrez
Assistant Examiner—Brij B. Shrivastav
(74) Attorney, Agent, or Firm—Thomas M. Lundin, Esq.

(57) ABSTRACT

The invention relates to a coil system which includes a plurality of series-connected coils (1, 2, 3, 4) which are provided with parallel coil turn configurations (10, 11, 12, 13) which are insulated from one another and connected to those of the neighboring coil (1, 2, 3, 4) so as to form conductive paths (10a, 11a, 12a, 13a) which span coils. Conventional coil systems have the drawback of lack of flexibility in respect of the numbers of turns. It is an object of the invention to provide a coil system which does not have an integer effective number of turns and nevertheless satisfies the requirements imposed as regards the quality of the magnetic field. In accordance with the invention it is proposed that the individual coils (1, 2, 3, 4) are provided with at least two groups of coil turn configurations (10, 11, 12, 13) whose numbers of turns deviate from one another and which are connected to the coil turn configurations (10, 11, 12, 13) of the respective neighboring coil (1, 2, 3, 4) in such a manner that the summed number of turns of each conductive path (10a, 11a, 12a, 13a) is the same. An advantage is offered by the freedom achieved as regards the choice of the number of turns of the coils.

7 Claims, 3 Drawing Sheets

COIL SYSTEM

BACKGROUND

Figure 1:
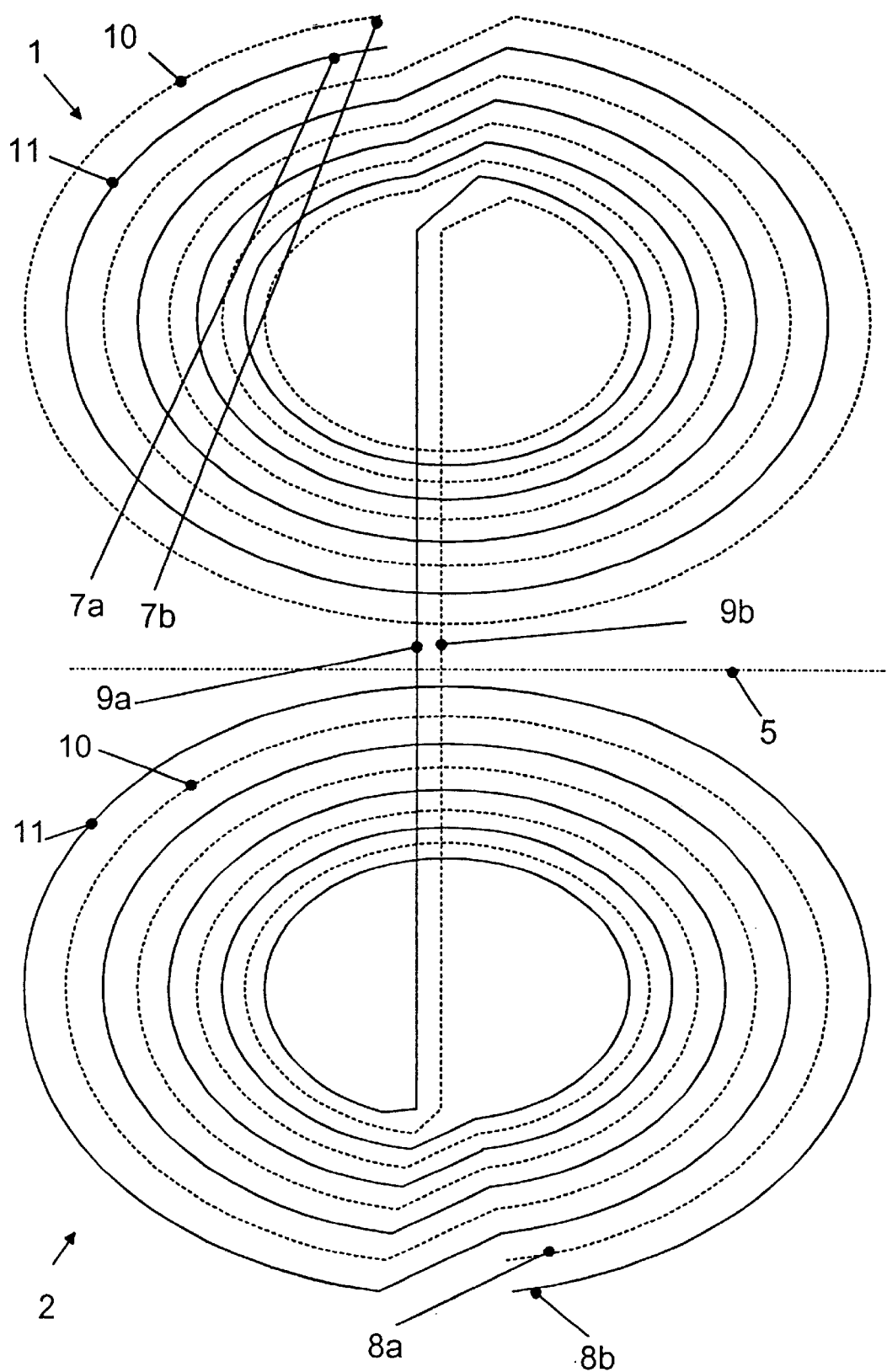

The invention relates to a coil system of an MR apparatus which is intended to generate gradient magnetic fields by means of a plurality of coils which are connected in series and each of which is provided with parallel coil turn configurations which are insulated from one another and connected to the coil turn configurations of the neighboring coil in the circuit arrangement so as to form conductive paths spanning coils.

In the context of a typical magnetic resonance imaging method the magnetic moment of the protons is oriented in one spatial direction by means of a strong, steady magnetic field of approximately 1.5 Tesla. The individual protons are excited to precession by means of brief, electromagnetic RF pulses, after which they become oriented again in conformity with the external, strong magnetic field. In particular the excitation and relaxation times and the frequencies of the precessional motions are dependent on the type of tissue and in the context of the measurement they provide, in conjunction with a position code of the excitation, information concerning the situation in space of various tissues. The position code utilizes position-dependent frequencies and phases of the precessional excitation and enables information as regards the location of the relevant emission to be derived via Fourier transformation of the measured MR signal.

In order to achieve a high image quality it makes sense to utilize several characteristics so as to distinguish the types of tissue being examined. A limiting factor in achieving a high image quality within an acceptable examination time consists in the speed at which the magnetic fields in the MR apparatus can be changed. Therefore, it is continuously being attempted to develop coil systems which enable high magnetic field strength transients to be obtained in conjunction with amplifiers and voltage sources.

In order to generate the magnetic field strength gradients desired for the position code, it is common practice to use different coil systems which extend in three mutually perpendicular spatial directions. Two Helmholz coils which face one another are usually arranged in the direction of the longitudinal axis of the body, that is, the axis which is usually referred to as the z direction. Generally speaking, in the direction perpendicular to the longitudinal axis of the body of the patient there are usually provided spiral-like planar coils which are arranged opposite one another so that they enclose the examination volume in a cylindrical fashion. Along the longitudinal axis of the body there are often provided two or more of such spiral-like coils which serve for a spatial direction extending perpendicularly to the longitudinal axis of the body. The two spatial directions which are oriented perpendicularly to the longitudinal axis of the body are generally referred to as the x direction and the y direction for which respective, separate coil systems of the latter kind are employed.

From British patent application GB 2 331 808 it is already known to configure a coil system with spiral-like, interleaved conductive paths of several series-connected identical coils in such a manner that the respective different conductive paths of each individual coil are connected to a dissimilar conductive path of the neighboring coil. The conductive paths resulting from the series connection of the individual coils are to be equalized in respect of their electrical properties in this manner.

The conventional coil systems have a drawback in that they lack flexibility in respect of the numbers of turns. The number of turns of the coil systems of, for example, an MR apparatus, should be adapted to the other components of the device or to the intended application. This is necessary, for example, in the case of active shielding of the magnetic stray fields. The design of the shielding coils is subject to the stray field arising, so that the design criterion to be satisfied in respect of the number of coil turns of the coil system for shielding is customarily a ratio of the numbers of turns of the coil system for the gradient field and the coil system for the shielding. This ratio is an integer number only rarely, so that this design criterion can usually be satisfied only by means of large numbers of turns of the shielding coil and the gradient coil. The quadratic contribution of the number of turns of a coil to the inductance makes that the design used thus far, for example, for active shields for stray fields is associated with high inductances and the voltages induced during the current strength transients impose severe requirements as regards the voltage source and the insulation.

SUMMARY

Considering the drawbacks and problems of the present state of the art, it is an object of the invention to provide a coil system which has a non-integer effective number of turns and nevertheless satisfies the requirements imposed as regards the quality of the magnetic field, notably as regards the symmetry and the homogeneity. It is also an object of the invention to provide a coil system for the active shielding of magnetic stray fields which has an as low as possible inductance and generates as low as possible voltages in phases of varying current flow.

The object is achieved in accordance with the invention by means of a coil system of the kind set forth in which the individual coils have at least two groups of coil turn configurations whose numbers of turns deviate from one another and which are connected to the coil turn configurations of the respective neighboring coils in such a manner that the number of turns summed over all coils is the same for each conductive path.

A special advantage of the coil system in accordance with the invention resides in the high degree of freedom as regards the choice of the number of turns of the coil turn configurations. The parallel coil turn configurations conduct identical currents because of their electrical properties which are substantially identical throughout the coil system and because of the parallel application of the operating voltage. The design of coil systems for generating gradient magnetic fields can be optimized in respect of inductance while utilizing non-integer effective numbers of turns.

In order to solve the described problems concerning the active shielding of magnetic stray fields, the invention proposes a coil system of the kind set forth which includes a first coil arrangement which generates the gradient magnetic field and a second coil arrangement which actively shields the stray field arising around the first coil arrangement, in which coil system the individual coils of at least the first or the second coil arrangement comprise at least two groups of coil turn configurations whose numbers of turns deviate from one another and which are connected to the coil turn configurations of the respective neighboring coil in such a manner that the number of turns summed over all coils is the same for each conductive path.

For the active shielding of magnetic stray fields generated by gradient magnetic field coils full benefit is derived from the advantages offered by coil systems in accordance with the invention. The ratio of the numbers of the turn configurations of the gradient magnetic field coil and the active stray field shielding coil, as defined by the configuration of the MR apparatus, is generally a random decimal number. Integer numbers of coil turn configurations as imposed thus far necessitated the choice of large numbers of turns in one or both coil systems in order to achieve an exact approximation in the interest of suitable shielding. Because in accordance with the invention the effective numbers of turn configurations of the coil systems are not necessarily integer numbers, it is possible to reduce the numbers of turns of the individual coils to a fraction while achieving the same shielding quality nevertheless. A ratio of, for example, 12.5 turn configurations of the gradient coil system to 7 coil turn configurations of the active shield as used thus far required a minimum number of 25 turns in the gradient magnetic field coil and 14 turns in the shielding coil system. Doubling the number of turns of the individual coils of the coil systems thus already multiplies the inductance by four and hence also the level of the voltage response to be expected in the case of the relevant current strength transients. In accordance with the invention the coil turn configuration can be split into two parallel, mutually insulated conductive paths or coil turn configurations, the number of turns of one of the two coil turn configurations being reduced by 1 so that the number of turns of the coil thus modified has the desired fraction of 0.5. The voltage response of this coil system to changes of the current flow is approximately that which results from the effective number of turns determined mathematically over the number of parallel extending coil turn configurations.

In order to generate and shield gradient magnetic fields which are oriented perpendicularly to the longitudinal axis of the body of the person to be examined, it is advantageous when the individual coils of the coil systems have coil turn configurations which are formed each time as parallel extending, interleaved, multi-turn spirals. For example, such spirals are cylindrically arranged around the volume to be examined and the magnetic fields of the coil systems for the so-called x direction and the y direction are oriented perpendicularly to one another.

For the direction of the longitudinal axis of the body of the patient to be examined, usually referred to as the z direction, the invention can be carried out by using coils which are constructed as Helmholz coils and whose coil turn configurations are formed each time so as to extend parallel to one another, radially or axially adjacent one another. Because of the helical arrangement of the coil turn configurations in the axial direction of the Helmholz coil, this embodiment offers even more degrees of freedom for the design than the more or less planar structure of the spiral-like gradient magnetic field coils in the x direction and the y direction.

In order to avoid detrimental crossings and more complex configurations of the connections of the various coil turn configurations of the individual coils, it is advantageous when the difference between the numbers of turns of the groups of coil turn configurations equals 1, a turn corresponding to a revolution of 360°. Practically any decimal number of effective numbers of turns can be realized with adequate precision by variation of the number of members of the individual groups having a different number of turns.

In order to ensure identical electrical properties it is useful when the number of series-connected coils is an integer multiple of the number of groups having a different number of turns. On the one hand, from a manufacturing point of view it is advantageous to construct the series-connected coils so as to be identical, while on the other hand an identical construction of the coils ensures that, when the coil turn configurations are connected accordingly, identical electrical properties are obtained for the individual coil turn configurations or conductive paths throughout the coil system. The choice of the number of series-connected coils as an integer multiple of the number of groups having a different number of turns enables the individual coil turn configurations, extending across the entire coil system, to be designed in such a manner that every different type of coil turn configuration in the individual coil is represented at least once in each conductive path extending throughout the coil system.

Further benefit can be derived from properties of symmetry, that is, to ensure identical electrical properties of the coil turn configurations extending throughout the coil system, when the numbers of coil turn configurations of the groups having a different number of turns have a common denominator and the product of this denominator and the number of groups having a different number of turns equals the number of coils.

DRAWINGS

Figure 2:
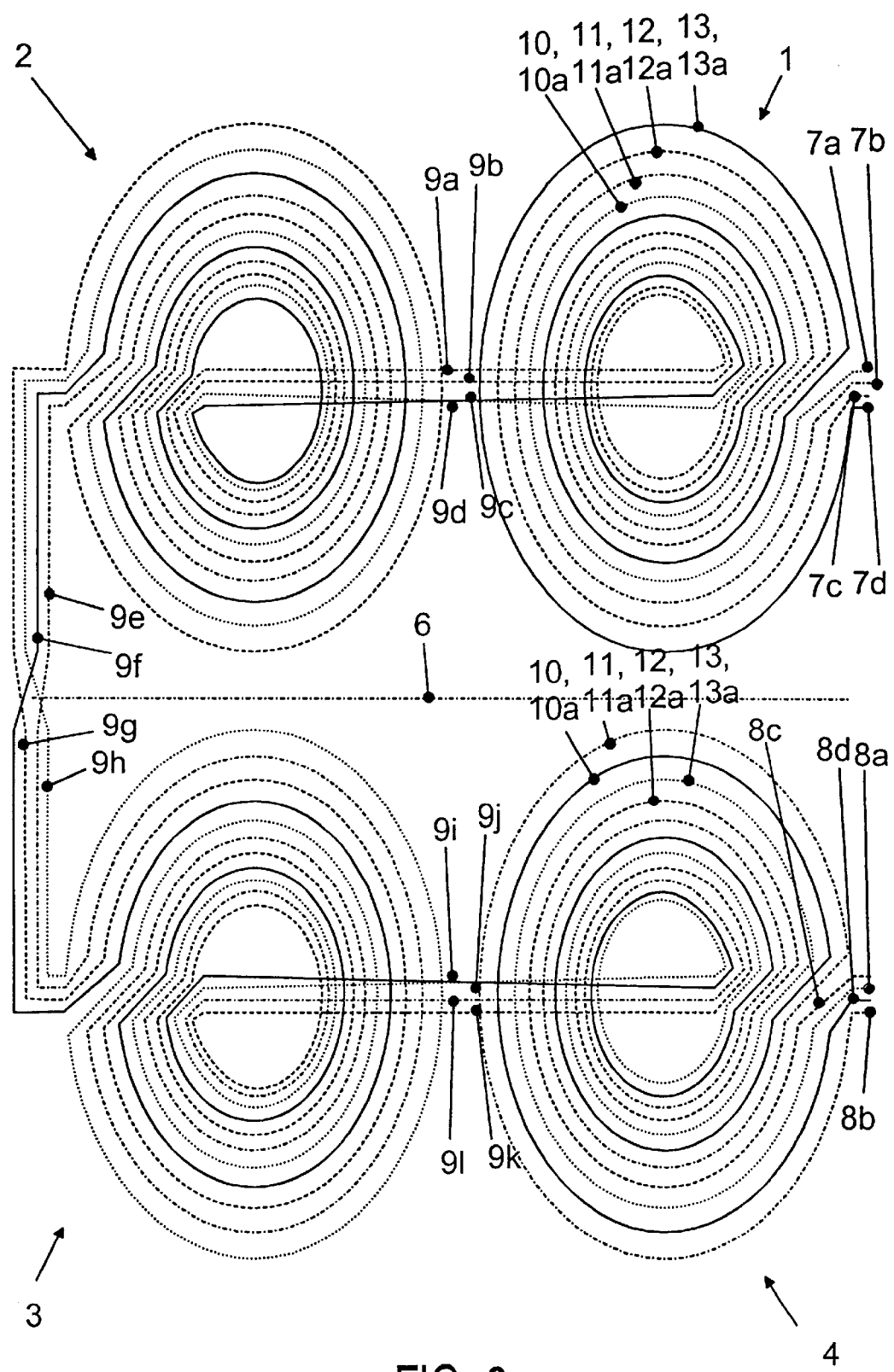
Figure 3:
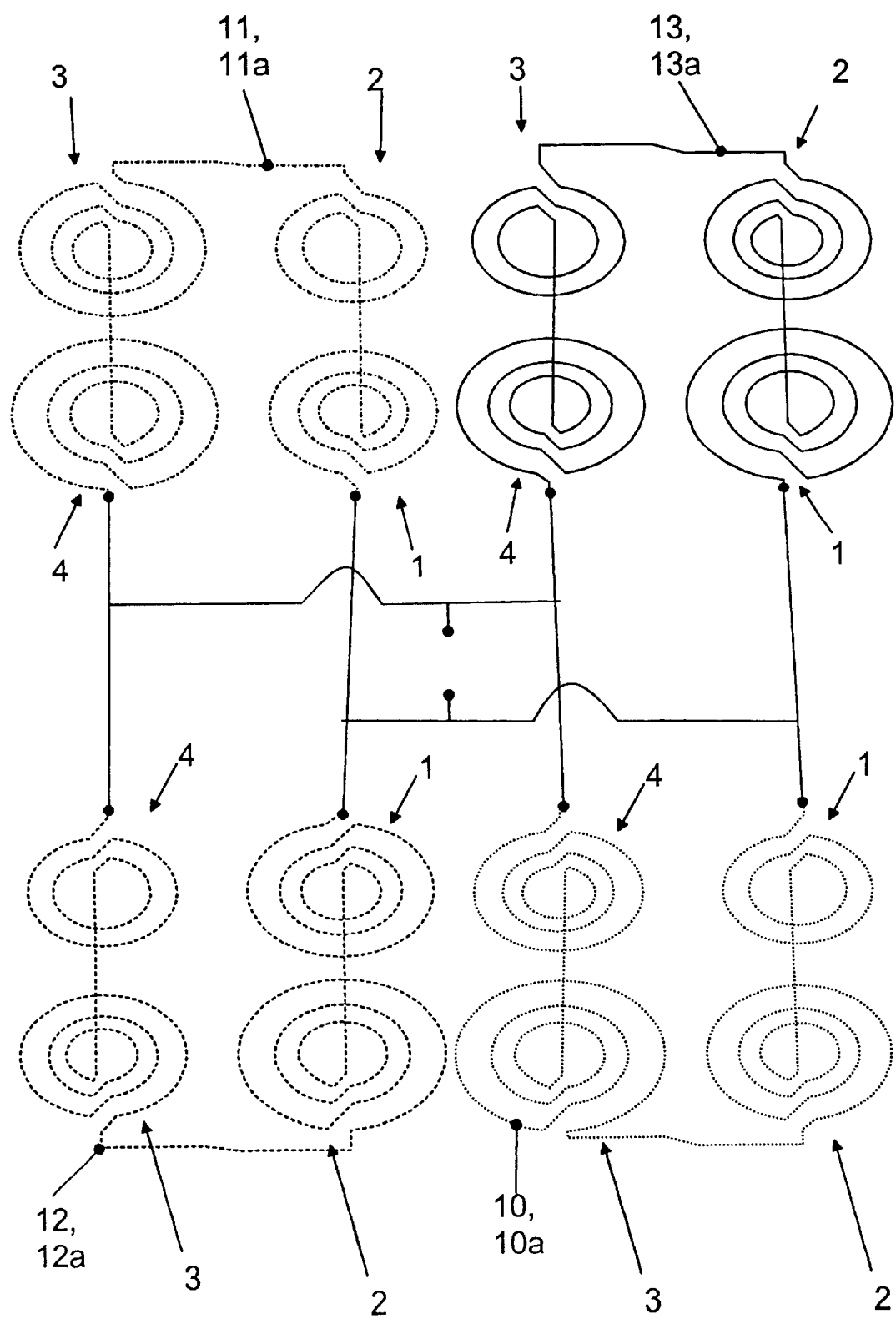

Two special embodiments of the invention will be described in detail hereinafter with reference to the drawings. Therein:

FIG. 1 is a diagrammatic representation of the coil turn configurations of a coil system with two series-connected coils, FIG. 2 is a diagrammatic representation of the coil turn configurations of four series-connected coils for generating a gradient magnetic field, and FIG. 3 shows an equivalent diagram of the coil system in accordance with the invention as shown in FIG. 2.

DESCRIPTION

FIG. 1 is a diagrammatic representation of two series-connected coils 1, 2. Both coils 1, 2 are constructed so as to be planar and are suitable mainly for generating gradient magnetic fields of an MR apparatus in a direction perpendicular to the longitudinal direction of the body, so in the x direction or the y direction. The two coils 1, 2 cylindrically enclose the examination volume in order to generate the gradient magnetic field. The second coil is formed by mirroring relative to the axis 5 as well as relative to an axis extending perpendicularly thereto. FIG. 1 is a diagrammatic representation of the individual coil turn configurations 10, 11 in a developed view. The coil turn configurations 10, 11 are represented by different types of lines for the purpose of distinction.

Two connections 7a, 7b at the input side and two connections 8a, 8b at the output side are connected in parallel (in a manner not shown) and receive the operating voltage. The two coils 1, 2 are connected to one another via connection conductors 9a, 9b.

The coil turn configurations 10, 11 extend parallel to one another in the form of interleaved spirals. The coil 2 is formed by mirroring the coil 1 relative to the axis 5 as well as relative to an axis perpendicular to the axis 5.

Between the individual coil turn configurations 10, 11 there is provided insulation (not shown) which may be of moderate proportions because the potential differences that occur are only small. In the example of FIG. 1 there are only two groups having a different number of turns, only one coil turn configuration 10, 11 being represented in each group.

FIG. 2 shows four coils 1, 2, 3, 4, each coil 1, 2, 3, 4 having four coil turn configurations 10, 11, 12, 13.

The coils 3, 4 are formed by mirroring the coils 1, 2 relative to the symmetry axis 6. In the case of a cylindrical arrangement of the coils 1, 2, 3, 4 in an MR apparatus, the symmetry axis 6 extends parallel to the longitudinal axis of the body. The coils 1, 2 and 3, 4 which are situated opposite one another in a cylindrical arrangement generate opposing magnetic fields in the examination volume because of the opposing flow direction of the currents, resulting in a substantially linear gradient of the magnetic field across a given area at the center of the cylindrical arrangement.

The parallel coil turn configurations 10, 11, 12, 13 of the individual coils 1, 2, 3, 4 receive an identical voltage throughout the entire coil system; practically the same current flows through each individual coil turn configuration 10, 11, 12, 13 because, due to the connection of the individual coil turn configurations 10, 11, 12, 13 of the individual coils 1, 2, 3, 4 to one another, the electrical properties of each conductive path 10a, 11a, 12a, 13a are sufficiently equal throughout the coil system.

The number of two groups having a different number of turns of the coil turn configurations 10, 11, 12, 13 in this case corresponds to half the number of coils 1, 2, 3, 4. A group having a number of turns amounting to two is then represented by one coil turn configuration 10, 11, 12, 13 in each coil 1, 2, 3, 4, and the second group, having a number of turns equal to 3, is represented by three coil turn configurations 10, 11, 12, 13 in each coil 1, 2, 3, 4. Each conductive path 10a, 11a, 12a, 13a considered in the coil system contains each time one coil turn configuration 10, 11, 12, 13 of a coil 1, 2, 3, 4 having only two turns.

The individual coil turn configurations 10, 11, 12, 13 in each coil have a total covered angle of 720° or 1080°, so that an angle of 3960° is obtained as the total covered angle for a conductive path 10a, 11a, 12a, 13a through the entire coil system. The effective number of turns of this coil device thus amounts to 2.75 turns per coil.

The equivalent diagram shown in FIG. 3 gives an impression of the number of turns of individual coil turn configurations 10, 11, 12, 13 in the individual coils 1, 2, 3, 4 and their connection in series so as to form conductive paths 10a, 11a, 12a, 13a extending through the entire coil system. The parallel conductive paths 10a, 11a, 12a, 13a all receive the same voltage.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A coil system of an MR apparatus for generating gradient magnetic fields, the coil system comprising:

a plurality of individual coils connected in series and each of which is provided with parallel coil turn configurations which are insulated from one another and connected to the coil turn configurations of the neighboring coil in a circuit arrangement so as to form conductive paths spanning coils, wherein the individual coils have at least two groups of coil turn configurations whose numbers of turns deviate from one another and which are connected to the coil turn configurations of the respective neighboring coil in such a manner that the number of turns summed over all coils is the same for each conductive path.

2. A coil system as claimed in claim 1, wherein the coil turn configurations of the individual coils are formed each time as parallel extending, interleaved multi-turn spirals.

3. A coil system as claimed in claim 1, wherein the individual coils are constructed as Helmholz coils and that the coil turn configurations of the individual coils are constructed each time so as to extend parallel to one another.

4. A coil system as claimed in claim 1, wherein the difference between the numbers of turns of the groups of the coil turn configurations equals one, one turn corresponding to a revolution of 360°.

5. A coil system as claimed in claim 1, wherein the number of series-connected coils is an integer multiple of the number of groups having a different number of turns.

6. A coil system as claimed in claim 1, wherein the numbers of coil turn configurations of the groups having a different number of turns have a common denominator and that the product of this denominator and the number of groups having a different number of turns equals the number of coils.

7. A coil system of an MR apparatus for generating gradient magnetic fields, the coil system comprising:

a plurality of individual coils connected in series and each of which is provided with parallel coil turn configurations which are insulated from one another and connected to the coil turn configurations of the neighboring coil in a circuit arrangement so as to form conductive paths spanning coils, in which system a first coil arrangement generates the gradient magnetic field and a second coil system actively shields the stray field arising around the first coil arrangement, wherein the individual coils of at least the first or the second coil arrangement comprise at least two groups of coil turn configurations whose numbers of turns deviate from one another and which are connected to the coil turn configurations of the respective neighboring coil in such a manner that the number of turns summed over all coils is the same for each conductive path.

* * * * *